(12) United States Patent
Kameshima et al.

(10) Patent No.: US 12,002,907 B2
(45) Date of Patent: Jun. 4, 2024

(54) LIGHT EMITTING MODULE AND METHOD FOR MANUFACTURING SAME

(71) Applicant: NICHIA CORPORATION, Anan (JP)

(72) Inventors: Yumiko Kameshima, Anan (JP); Eiko Minato, Anan (JP); Koji Taguchi, Anan (JP); Masaaki Katsumata, Anan (JP)

(73) Assignee: NICHIA CORPORATION, Anan (JP)

( * ) Notice: Subject to any disclaimer, the term of this patent is extended or adjusted under 35 U.S.C. 154(b) by 581 days.

(21) Appl. No.: 17/280,047

(22) PCT Filed: Sep. 27, 2019

(86) PCT No.: PCT/JP2019/038337
§ 371 (c)(1),
(2) Date: Mar. 25, 2021

(87) PCT Pub. No.: WO2020/067495
PCT Pub. Date: Apr. 2, 2020

(65) Prior Publication Data
US 2022/0037567 A1    Feb. 3, 2022

(30) Foreign Application Priority Data

Sep. 28, 2018 (JP) ................................. 2018-185819

(51) Int. Cl.
*H01L 33/54* (2010.01)
*H01L 23/00* (2006.01)
(Continued)

(52) U.S. Cl.
CPC .............. *H01L 33/54* (2013.01); *H01L 24/96* (2013.01); *H01L 25/0753* (2013.01);
(Continued)

(58) Field of Classification Search
CPC ..... H01L 33/54; H01L 24/96; H01L 25/0753; H01L 33/60; H01L 33/62; H01L 24/29;
(Continued)

(56) References Cited

U.S. PATENT DOCUMENTS

2002/0039808 A1* 4/2002 Fukutomi ........... H01L 23/4985
257/E23.125
2008/0254650 A1* 10/2008 Kadotani ................ H01L 33/54
29/832

(Continued)

FOREIGN PATENT DOCUMENTS

CN    207529081 U    6/2018
JP    2011-040715 A    2/2011
(Continued)

*Primary Examiner* — S M Sohel Imtiaz
(74) *Attorney, Agent, or Firm* — Foley & Lardner LLP

(57) ABSTRACT

A light emitting module includes: a base board; and a plurality of divisional planar light emitters disposed adjacent to each other on one surface of the base board. The base board includes: a plurality of conductive parts, a flexible base part joined to the conductive parts, and an insulating base part joined to the flexible base part. Each of the plurality of divisional planar light emitters includes: a plurality of wiring parts electrically connected with corresponding ones of the conductive parts of the base board, a plurality of light emitting elements each disposed on corresponding ones of the wiring parts, and a sealing part sealing the plurality of light emitting elements and facing the insulating base part.

18 Claims, 9 Drawing Sheets

(51) Int. Cl.
*H01L 25/075* (2006.01)
*H01L 33/60* (2010.01)
*H01L 33/62* (2010.01)
*H01L 33/56* (2010.01)

(52) U.S. Cl.
CPC .............. *H01L 33/60* (2013.01); *H01L 33/62* (2013.01); *H01L 24/29* (2013.01); *H01L 24/32* (2013.01); *H01L 24/73* (2013.01); *H01L 33/56* (2013.01); *H01L 2224/2919* (2013.01); *H01L 2224/29191* (2013.01); *H01L 2224/32225* (2013.01); *H01L 2224/73217* (2013.01); *H01L 2224/96* (2013.01); *H01L 2924/12041* (2013.01); *H01L 2933/005* (2013.01); *H01L 2933/0066* (2013.01)

(58) Field of Classification Search
CPC ......... H01L 24/32; H01L 24/73; H01L 33/56; H01L 24/13; H01L 24/97; H01L 33/50; F21S 2/00
See application file for complete search history.

(56) References Cited

U.S. PATENT DOCUMENTS

| | | | | |
|---|---|---|---|---|
| 2012/0187437 | A1* | 7/2012 | Yoo | H01L 33/486 257/E33.059 |
| 2013/0248894 | A1* | 9/2013 | Nakamura | H01L 33/62 438/22 |
| 2015/0028372 | A1* | 1/2015 | Nakanishi | H01L 33/486 257/98 |
| 2016/0035942 | A1* | 2/2016 | Hsing Chen | H01L 33/486 257/88 |
| 2017/0033267 | A1* | 2/2017 | Tamaki | H01L 33/508 |
| 2017/0154880 | A1* | 6/2017 | Ozeki | H01L 24/26 |
| 2017/0263837 | A1* | 9/2017 | Jeon | H01L 33/62 |
| 2018/0040773 | A1* | 2/2018 | Fukuda | H01L 33/46 |
| 2018/0239193 | A1 | 8/2018 | Hayashi | |

FOREIGN PATENT DOCUMENTS

| | | |
|---|---|---|
| JP | 2013-225643 A | 10/2013 |
| JP | 2015-026746 A | 2/2015 |
| JP | 2015-029078 A | 2/2015 |
| JP | 2017-028190 A | 2/2017 |
| JP | 2018-018918 A | 2/2018 |
| JP | 2018-133304 A | 8/2018 |

\* cited by examiner

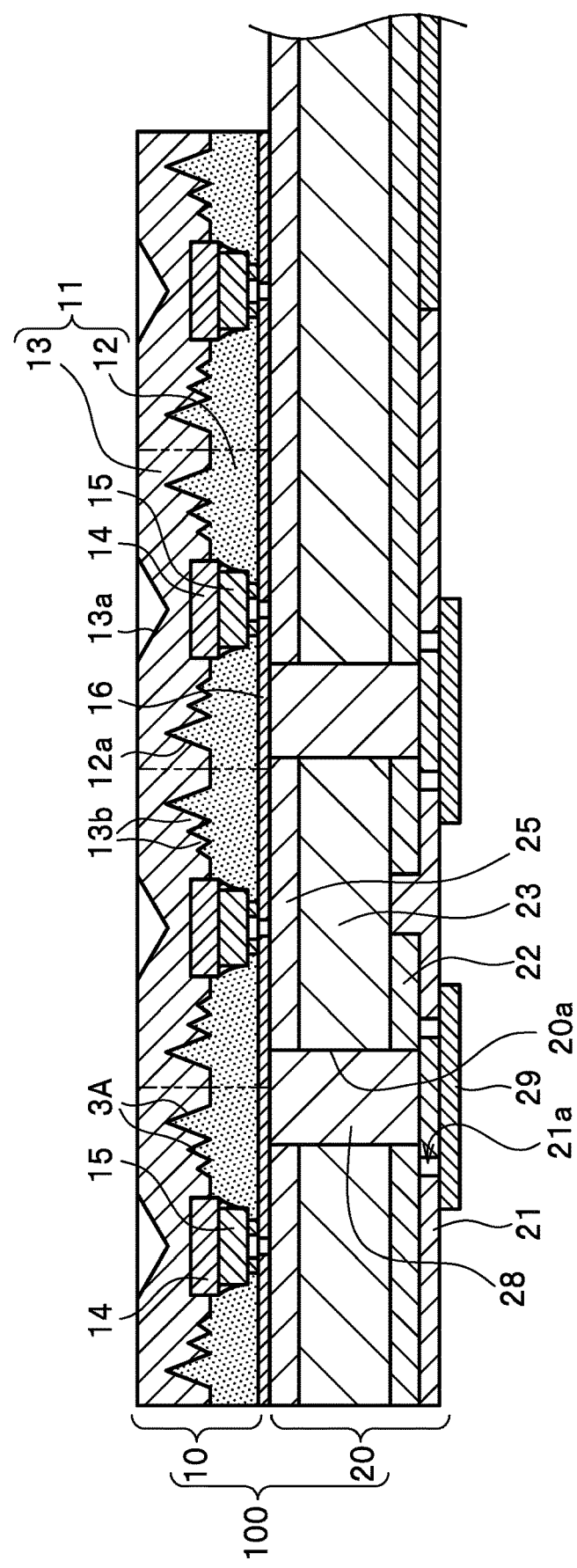

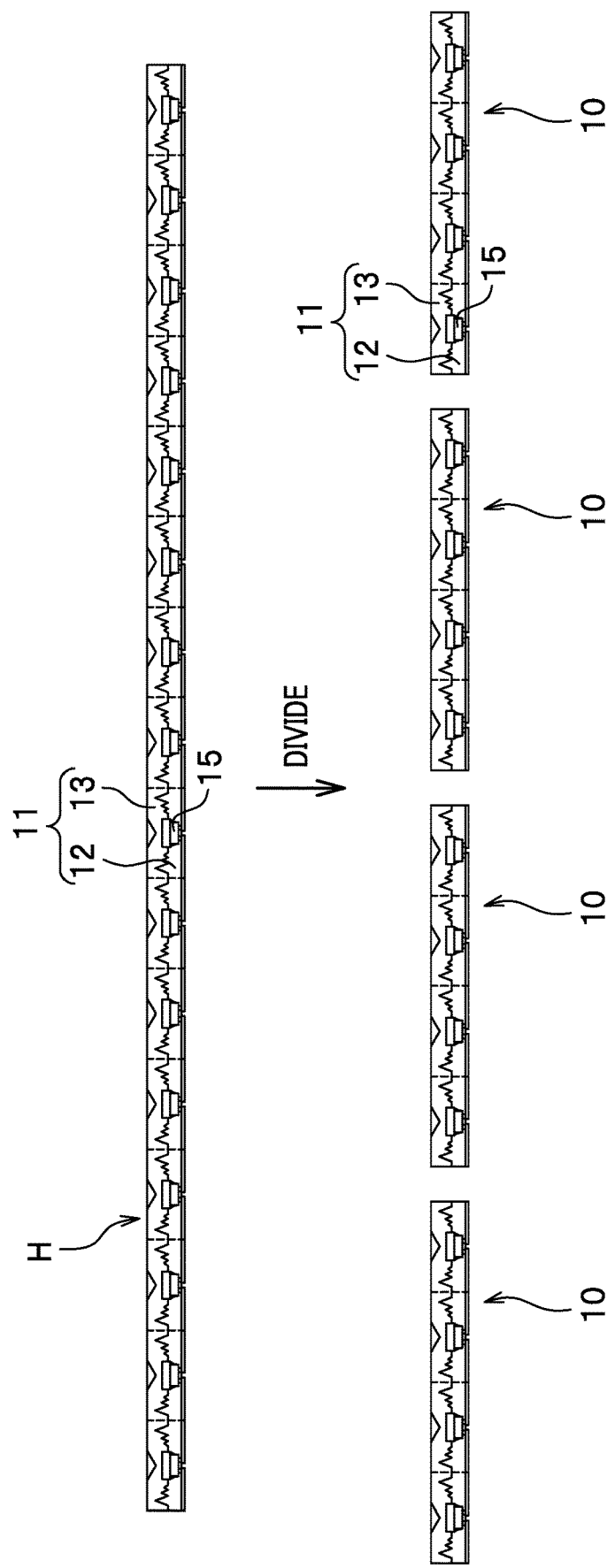

LIGHT EMITTING MODULE AND METHOD FOR MANUFACTURING SAME

CROSS REFERENCE TO RELATED APPLICATIONS

This is a National Stage Application of PCT Application No. PCT/JP2019/038337, filed on Sep. 27, 2019, which claims priority to Japanese Patent Application No. 2018-185819, filed on Sep. 28, 2018.

TECHNICAL FIELD

The present disclosure relates to a light emitting module and a method for manufacturing the light emitting module.

BACKGROUND ART

A structure known as a conventional light emitting module (light emitting element package) on which light emitting elements are mounted (Patent Literature 1) includes: a base board; wiring formed on one surface of the base board to constitute a light emitting element mounting part on which the light emitting elements are mounted; and through-wiring penetrating the base board and having one end electrically connected with the light emitting element mounting part and the other end projecting from the other surface of the base board to form a connection terminal. The light emitting element mounting part includes two areas arranged with a predetermined gap therebetween in plan view. The two areas are each provided with the through-wiring. One of the two areas has a connection part formed therein connected with one electrode of a light emitting element. The other of the two areas has another connection part formed therein connected with the other electrode of the light emitting element.

The above-described light emitting module suffers from complexity of the method of manufacturing because the light emitting element is mounted on the base board and positioned and then sealed with sealing resin. For this reason, there has been developed a workaround by forming a plate-like workpiece (hereinafter referred to as "plate-like body") including a plurality of light emitting elements and sealing resin and heat bonding the workpiece onto a base board.

Patent Literature 1: Japanese Patent Publication No. 2013-225643

SUMMARY OF THE INVENTION

However, as the plate-like body and the base board have different linear expansion coefficients, there is a concern that warping of the plate-like body may occur in the event of heat bonding, decreasing the reliability of the light emitting module.

The embodiments according to the present disclosure have been devised to resolve the above-described problems, and it is an object of the embodiments to provide a high-quality light emitting module which can be manufactured easily and to provide a method for manufacturing the high-quality light emitting module.

A light emitting module according to a present embodiment includes: a base board; and a plurality of divisional planar light emitters disposed adjacent to each other on one surface of the base board. The base board includes: conductive parts; a flexible base part joined to the conductive parts; and an insulating base part joined to the flexible base part. Each of the plurality of divisional planar light emitters includes: wiring parts electrically connected with corresponding ones of the conductive parts of the base board, a plurality of light emitting elements each disposed on corresponding ones of the wiring part, and a sealing part sealing the plurality of light emitting elements and facing the insulating base part.

A method for manufacturing a light emitting module according to the present embodiment includes: preparing a base board in which conductive parts, a flexible base part, and an insulating base part are laminated; preparing a plurality of divisional planar light emitters resulted in dividing a workpiece so that each of the plurality of divisional planar light emitters includes wiring parts, a plurality of light emitting elements each disposed on corresponding ones of the wiring parts, and a sealing part that seals the plurality of light emitting elements; forming through-holes in the base board in a thickness direction thereof at predetermined positions, disposing the plurality of divisional planar light emitters on the insulating base part of the base board to form a plate-like structure; establishing electrical connections that electrically connect the wiring parts of each of the plurality of divisional planar light emitters to corresponding ones of the conductive parts of the base board through corresponding ones of the through-holes; and curing the plate-like structure by pressing and heating upper and lower surfaces of the plate-like structure.

With these, it is possible to provide a high-quality light emitting module which can be manufactured easily and to provide a method for manufacturing the high-quality light emitting module.

BRIEF DESCRIPTION OF THE DRAWINGS

FIG. 1A is an enlarged cross-sectional view schematically illustrating a part of a light emitting module according to a first embodiment.

FIG. 4 is an explanatory diagram schematically illustrating the entirety and a divisional state of the divisional planar light emitters used in the light emitting module according to the first embodiment.

DETAILED DESCRIPTION

Figure 1B:
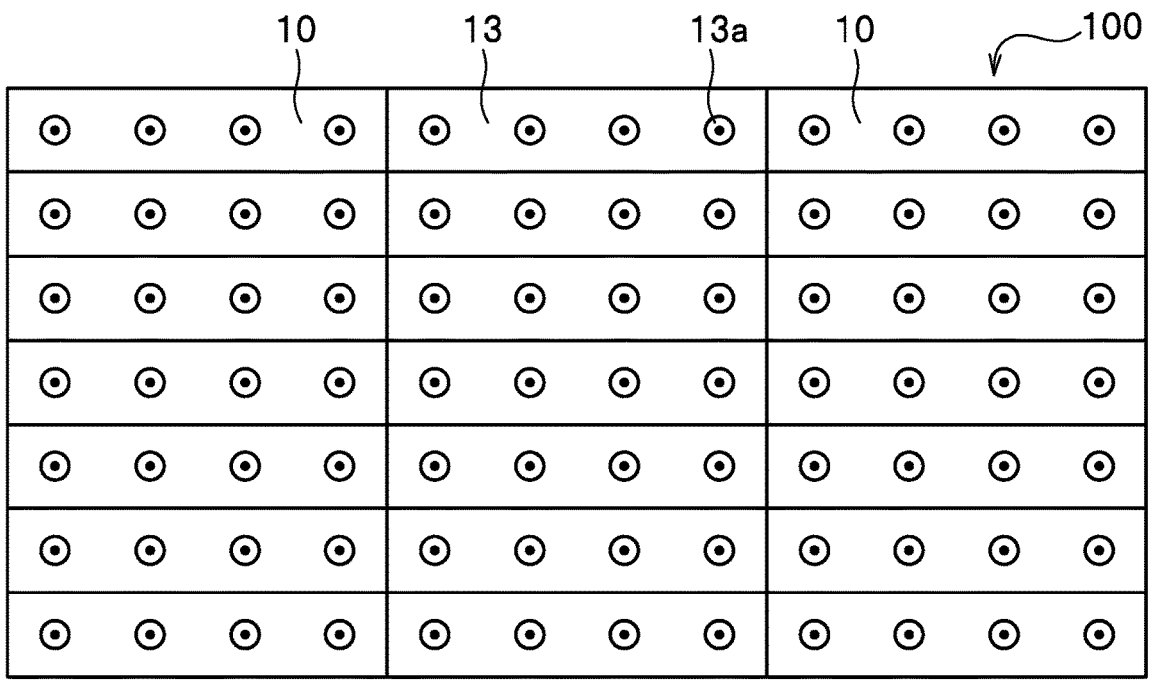
FIG. 1B is a plan view illustrating the light emitting module according to the first embodiment.

Hereinafter, the present disclosure is explained in detail with reference to the drawings. In the description below, terms indicative of a specific direction or position (e.g., "upper" and "lower" and other analogous terms) are used as necessary. The use of such terms is to ease understanding of the invention with reference to the drawings. The meanings of those terms do not limit the technical scope of the present inventions. Parts designated by the same reference sign in the drawings indicate the same part or member.

In addition, the embodiments described below are intended to give a concreate form to the technical ideas of the present invention and the scope of the invention is not limited to those described below. Unless otherwise stated, the dimensions, materials, shapes, relative positions, and the like of the constituent components described in the embodiments below are not intended to limit the scope of the invention thereto and are intended to give examples.

Figure 2:
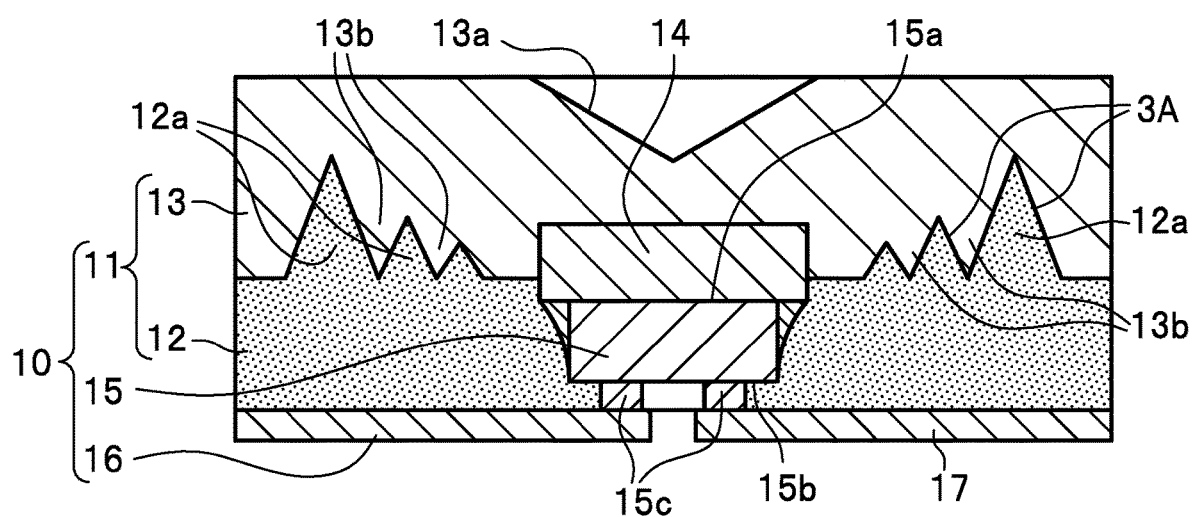
FIG. 2 is an enlarged cross-sectional view illustrating a part of a divisional planar light emitter according to the first embodiment.

First, a description will be given of the configuration of a light emitting module with reference to FIGS. 1A, 1B, and 2. FIG. 1A is a cross-sectional view illustrating a light emitting module according to a first embodiment. FIG. 1B is a plan view illustrating the light emitting module according to the first embodiment. FIG. 2 is an enlarged cross-sectional view illustrating a part of a divisional planar light emitter according to the first embodiment.

<Light Emitting Module>

A light emitting module 100 is to be used for a liquid crystal display device, for example. The light emitting module 100 includes: a wiring board 20 serving as a base board, and a plurality of divisional planar light emitters 10 attached to an upper surface (one surface) of the wiring board 20.

Hereinafter, components of the light emitting module 100 will be described in detail.

(Divisional Planar Light Emitter)

The divisional planar light emitters 10 are disposed on the upper surface of the wiring board 20 with gaps that are unrecognizable when viewed by an observer therebetween, and are each configured to emit light from light emitting elements 15 from a light extraction surface. Preferably, each divisional planar light emitter 10 is formed in a rectangular shape in plan view with, for example, a set of four light emitting elements 15 so that the long side of the rectangular shape has a length of 30 mm or less at maximum. Each divisional planar light emitter 10 includes wiring parts 16, a plurality of light emitting elements 15 disposed on the wiring parts 16, and a sealing part 11 that seals the light emitting elements 15.

The divisional planar light emitters 10 illustrated in FIG. 1B each have four light emitting elements 15 and are arranged in a 7-row, 3-column array to construct the light emitting module 100. Incidentally, when a monitor is constructed using light emitting modules 100, they each measure about 200 mm by 300 mm. Accordingly, when using 10 mm square divisional planar light emitters 10, an assembly of 600 divisional planar light emitters 10 are used. The light emitting elements included in a divisional planar light emitter 10 are, in general, spaced apart by 1.0 mm to 10 mm, though dependent on the design. The light emitting module 100 may be constructed with divisional planar light emitters 10 in each of which a plurality light emitting elements 15 are arranged in 4 rows by 4 columns. The divisional planar light emitter 10 may have another number of light emitting elements in: 16 divisional areas with 4 rows by 4 columns, 36 divisional areas with 6 rows by columns, 64 divisional areas with 8 rows by 8 columns, 12 divisional areas with 3 rows by 4 columns, 15 divisional areas with 5 rows by 3 columns, or 21 divisional areas with 7 rows by 3 columns.

Adjacent divisional planar light emitters 10 are spaced apart preferably by a gap of 150 μm or less, or more preferably by a gap of 120 μm or less, or still more preferably by a gap of 90 μm or less. This is because the smaller the gap, the divisional planar light emitters are more easily aligned uniformly. On the other hand, preferably, adjacent divisional planar light emitters 10 are spaced apart by a gap of 22 μm or greater or by a gap of 28 μm or greater. This is because providing a predetermined amount of gap makes it possible to relax the bending stress.

Preferably, the divisional planar light emitter 10 is formed with a thickness of 0.3 mm to 2 mm, for example. A thick divisional planar light emitter 10 is disadvantageous in reducing the thickness of the light emitting module, whereas an excessively thin divisional planar light emitter 10 may not diffuse light sufficiently and thus is disadvantageous in obtaining uniform light.

(Sealing Part)

The sealing part 11 is disposed to seal and cover the light emitting elements 15 and to cover the wiring parts 16. The sealing part 11 serves to emit planar light and is provided opposite to an insulating base part 21 (and a flexible base part 23). The sealing part 11 incudes: a light transmissive part 13 that transmits the light from the light emitting elements 15 toward a light extraction surface; and a reflective part 12 that reflects the light from the light emitting elements 15 toward the light extraction surface. In the sealing part 11, the reflective part 12 is formed with a height extending from the wiring parts 16 to a position exceeding the height of the light emitting elements 15, and the light transmissive part 13 is formed from the reflective part 12 to a front surface of the sealing part 11, which front surface is the light extraction surface.

(Reflective Part)

The reflective part 12 enhances support of the light emitting elements 15 and is provided on the side surfaces of the light emitting elements 15 and in a peripheral area of the light emitting elements 15 to improve the light extraction efficiency. Preferably, the reflective part 12 is a light reflective member. The reflective part 12 is to have a reflection ratio of 60% or more, or preferably a reflection ratio of 90% or more, with respect to the light emitted from the light emitting elements 15. Forming the reflective part 12 with a light reflective member makes it possible to effectively reflect the light from the light emitting elements 15 to the light transmissive part 13 and cause the light transmissive part 13 to take in the light.

Preferably, the light reflective member is made of a resin containing a white pigment or the like. The light reflective member is to be used in a relatively large quantity for the purpose of covering the light emitting elements 15. It is preferable to use a silicone resin containing inexpensive titanium oxide as the light reflective member to lower the cost of the light emitting module 100.

The reflective part 12 forms unevenness 12a around an element light transmissive part 14 provided facing the light extraction surface of each of the light emitting elements 15. The unevenness 12a is formed by the light reflective resin of the reflective part 12 having entered grooves 3A formed in the light transmissive part 13 and having a Fresnel shape. The unevenness 12a is formed so as to reflect the light from the corresponding light emitting element 15 or element light transmissive part 14 to the light extraction surface of the light emitting module 100. In the present embodiment, the unevenness 12a is formed concentrically with the corresponding light emitting element 15 such that a larger convex is located at a larger distance from the light emitting element 15.

(Light Transmissive Part)

The light transmissive part 13 transmits the light from the light emitting elements 15 and outputs the light to the outside. The light transmissive part 13 has an upper surface forming a part of the light extraction surface of the light emitting module 100. The light transmissive part 13 is continuously formed on the reflective part 12 and formed so as to cover the light emitting elements 15. The light transmissive part 13 has optical function parts 13a each formed at an upper position opposite to a corresponding one of the light emitting elements 15 and each having a recessed shape such that a width of the recessed shape increases as the recessed shape extends from a side thereof near a principal light emitting surface 15a of the light emitting element 15 toward a side near the upper surface of the light transmissive part 13. In other words, the light transmissive part 13 is formed such that the principal light emitting surface 15a of each light emitting element 15 is located at a lower position facing the corresponding optical function part 13a. The optical function part 13a functions to refract or reflect the light transmitted from the light emitting element 15 located under the optical function part 13a so that uniform light can be extracted from the light extraction surface of the light emitting module 100. As described, the divisional planar light emitter 10 preferably has, directly above each light emitting element 15 in plan view, such an optical function part 13a that refracts or reflects the light from the light emitting element 15.

The optical function part 13a is a recess with an inverted cone shape that is formed in the front surface side of the light transmissive part 13 as a part serving as a lens. The shape of the recess may be another shape, e.g., an inverted polygonal pyramid, so long as the shape provides the same function. The optical function part 13a may house a material (e.g., air, resin, or glass) with a refractive index different from that of the light transmissive part 13 thereby to refract or reflect light at the interface between the material and the inclined surface of the recess so that uniform light can be emitted from the light extraction surface of the light emitting module 100. The optical function part 13a causes total reflection and dispersion of the light of the light emitting element 15 to extract the light from the light transmissive part 13 even from a part thereof not located directly above the light emitting element 15, to prevent the light from being enhanced due to concentration of the light at the optical function part 13a located directly above the light emitting element 15. The size or depth of the recess of the optical function part 13a can be set in relation to the light emitting element 15 as appropriate.

Preferably, each of the optical function parts 13a is formed at a position opposite to the wiring board 20 with respect to the corresponding light emitting element 15. More preferably, each of the optical function parts 13a is formed at a position such that the optical axis of the optical function part 13a substantially coincides with the optical axis of the corresponding light emitting element 15.

Preferably, a reflective member is disposed in the inverted cone-shaped recess of the optical function part 13a. For example, the recess may have a sloped surface with a linear or curved configuration (in cross-sectional view), on which sloped surface a light reflective material (e.g., a reflective film made of a metal or the like or a white resin containing titanium oxide or the like) may be disposed.

Incidentally, the optical function part 13a may be provided in various configurations. An example is to configure the light transmissive part 13 to include a member with a function of causing reflection or diffusion, such as a lens.

Incidentally, the light transmissive part 13 may have Fresnel shaped grooves 3A on a side thereof which is on the light emission surface side of the light emitting element 15, and the grooves 3a may be filled with a light reflective resin to form the reflective part. The unevenness 12a, which causes diffusion of the light from the light emitting elements 15, is formed for each of the light emitting elements 15 at the joint surface between the light transmissive part 13 and the reflective part 12. This unevenness 12a is to be formed in a shape that effectively diffuses the light to be extracted from the light extraction surface of the light emitting module 100 and is not limited to a specific shape. The light transmissive part 13 may have a front surface in which unevenness or a lens is formed, to facilitate diffusion of the light. Incidentally, the light transmissive part 13 has unevenness 13b formed due to the formation of the grooves 3A, to be in contact with the unevenness 12a of the reflective part 12.

The material to be used as the light transmissive part 13 may be a resin material or an optically transparent material. The resin material may be a thermoplastic resin or a thermosetting resin. Examples of the thermoplastic resin include acrylics, polycarbonates, cyclic polyolefins, polyethylene terephthalates, and polyesters. Examples of the thermosetting resin include epoxies and silicones. Examples of the optically transparent material include glasses. In particular, thermoplastic resin materials are preferable because injection molding can be used to fabricate the product efficiently. Among them, polycarbonates, which have high transparency and are inexpensive, are more preferable.

The light transmissive part 13 can be molded by injection molding or transfer molding. Preferably, the light transmissive part 13 is molded collectively with the optical function parts 13a using a mold.

The light transmissive part 13 may be formed in a single layer or may be formed by laminating a plurality of light transmissive layers. When the light transmissive part 13 is formed by laminating a plurality of light transmissive layers, it is preferable that layers with different refractive indices, e.g., layers of air or the like, be interposed between the layers, for the purpose of facilitating diffusion of the light to reduce unevenness in the brightness of the light emitting module. Such a configuration can be constructed by inserting spacers between a plurality of light transmissive layers to create spaces therebetween to create layers of air. The light emission surface side of the light transmissive part 13 may be added with a necessary amount of a light diffusion material composed of titanium oxide and the like, to emit light widely.

(Light Emitting Element)

The light emitting elements 15 serves as light sources of the light emitting module 100 and are semiconductor elements that emit light by themselves upon application of a voltage. The light emitting elements 15 each include a light transmissive substrate serving as an element substrate, the principal light emitting surface 15a from which the light is to be extracted mainly, a pair of element electrodes 15c formed on an electrode formation surface 15b and located on the side opposite to the principal light emitting surface 15a. The light emitting elements 15 may each be provided with the element light transmissive part 14 joined to the principal light emitting surface 15a via a light guiding member. Each pair of element electrodes 15c are disposed so as to face the below-described wiring board 20 and are electrically connected with corresponding ones of conductive parts 22 of the wiring board 20 through the corresponding wiring parts 16 and corresponding ones of the conductive members 28 in via holes 20a of the wiring board 20. Preferably, the element light transmissive part 14 is present between the light emitting element 15 and the light transmissive part 13. The element light transmissive part 14 preferably contains a wavelength conversion member that converts the wavelength of the light from the light emitting element 15. Examples of a phosphor usable as the wavelength conversion member and excitable by light emitted from a blue light emitting element or an ultraviolet light emitting element include: cerium-activated yttrium-aluminum-garnet-based fluorescent materials (YAG:Ce); cerium-activated lutetium-aluminum-garnet-based fluorescent materials (LAG:Ce); europium- and/or chromium-activated nitrogen-containing calcium aluminosilicate based fluorescent materials (CaO—$Al_2O_3$—$SiO_2$); europium-activated silicate-based fluorescent materials (($Sr,Ba)_2SiO_4$); nitride-based fluorescent materials such as β-sialon fluorescent materials, CASN-based fluorescent materials, SCASN-based fluorescent materials; KSF-based fluorescent materials ($K_2SiF_6$:Mn); sulfide-based fluorescent materials; and quantum dot fluorescent materials. A combination of those phosphors and a blue light emitting element or an ultraviolet light emitting element can be used to fabricate light emitting devices configured to emit various colors (e.g., a light emitting device configured to emit a white light).

Each light emitting element 15 includes a light transmissive substrate, examples of which include a sapphire substrate, and a semiconductor stack structure disposed on the light transmissive substrate. The semiconductor stack structure includes an n-type semiconductor layer, a p-type semiconductor layer, and a light emitting layer interposed therebetween. The n-type semiconductor layer and the p-type semiconductor layer are electrically connected with an n-side electrode and a p-side electrode, respectively.

Preferably, nitride-based semiconductors are used as the semiconductor materials of the semiconductor stack structure. A nitride semiconductor is represented by a general formula $In_xAl_yGa_{1-x-y}N$ ($0 \leq x$, $0 \leq y$, $x+y \leq 1$). Other examples of the semiconductor materials that can be used include InAlGaAs-based semiconductors, InAlGaP-based semiconductors, zinc sulfides, zinc selenides, and silicon carbides.

The pair of element electrodes 15c may be made of gold, silver, tin, platinum, rhodium, titanium, aluminum, tungsten, palladium, nickel, or an alloy of one of the foregoing materials.

Examples of the base material of the element substrate include sapphire, gallium nitride, aluminum nitride, silicon, silicon carbide, gallium arsenide, gallium phosphorus, indium phosphorus, zinc sulfide, zinc oxide, zinc selenide, and diamond.

The shape and dimensions (length, width, and height) of the light emitting element 15 are not limited. However, it is preferable to use a light emitting element having a rectangular or square shape in plan view. However, it is preferable to use semiconductor light emitting elements each having length and width dimensions of 1000 μm or less (in plan view), to create a high-resolution image in the event of performing local dimming of a liquid crystal display device being used. Moreover, to create a high resolution image, it is more preferable to use light emitting elements 15 each having length and width dimensions of 500 μm or less, or it is still more preferable to use light emitting elements 15 each having length and width dimensions of 200 μm or less.

The light emitting elements 15 are, for example, disposed in a two-dimensional matrix form in a plan view of the sealing part 11. The distance between adjacent light emitting elements 15, which represents the density (arrangement pitch) of the light emitting elements 15, can be, for example, about 0.5 mm to 20 mm, and is preferably about 2 mm to 10 mm.

Known semiconductor light emitting elements can be used as the light emitting elements 15. The composition, emission color, size, and number of the light emitting elements to be used can be selected in accordance with the purpose as appropriate. The light emitting elements 15 can be selected to emit white light by using light sources configured to emit a single color light, e.g., blue light or white light, or by using a plurality of light emitting elements configured to emit different colors and mixing those colors (e.g., red, blue, and green).

Each of the plurality of light emitting elements 15 may be wired to be driven independently. Alternatively, the light emitting elements 15 may be grouped into a plurality of light emitting element groups each including a plurality of light emitting elements 15 electrically connected in series or in parallel to be connected to the same circuitry. Such grouping enables the light emitting module to perform local dimming.

(Wiring Part 16)

The lower surface of the reflective part 12 is located on the wiring board 20 side thereof. The wiring parts 16, which are to be electrically connected with the element electrodes 15c of the plurality of light emitting elements 15, are arranged on that lower surface, so that a circuit necessary in the event of application to a liquid crystal display device or the like can be easily formed. The wiring parts 16 are formed in a predetermined wiring pattern. The wiring is formed by sputtering of nickel or gold and then by using a laser or by lifting off. Alternatively, the wiring parts 16 may be formed by printing a conductive paste using screen printing and then performing curing. The conductive paste may contain: a metal filler containing, for example, one or more materials selected from silver, copper, nickel, tin, zinc, titanium and the like; an epoxy resin, an acrylic resin, a urethane resin, or a silicone resin; and, if necessary, a solvent. As the conductive paste, it is preferable to use a material that is cured at a temperature of 130° C. or less, or it is more preferable to use a material that is cured with a temperature of 110° C. or less, taking into account the heat resistance of the light transmissive part 13. Preferably, the wiring has a lower resistance. It is preferable to use a material with a resistance of $1.0 \times 10^{-4}$ Ω·cm or less for the wiring. The wiring may have a thickness of 20 μm or less or more preferably a thickness of 10 μm or less, to construct a thin light emitting module. As the material of the wiring parts 16, a known conductive material with high thermal conductivity can be used.

(Wiring Board)

The wiring board 20 (base board) has a layered structure including: from a side (lower side in FIG. 1A) opposite to the side to which the light emitting elements 15 are to be joined, an insulating base part 21, conductive parts 22 joined to the insulating base part 21, a flexible base part 23 joined to the conductive parts 22, and an adhesive sheet 25 joined to the flexible base part 23, which are laminated one after another. Accordingly, the wiring board 20 is flexible. Preferably, the thickness of the wiring board 20 is 0.01 times or more and 0.25 times or less the thickness of the divisional planar light emitter 10.

Incidentally, the wiring board 20 may be a composite material in which the above-described parts have been affixed in advance or may be formed by affixing those parts at appropriate timing.

The insulating base part 21 is a thin-film insulating member (solder resist or a cover lay) with a thickness of about 5 μm to 50 μm and can be formed of a known material. Preferably, the insulating base part 21 is formed of at least one selected from polyethylene naphthalate, polyethylene terephthalate, polyimide, polyamide, and epoxy resin.

The conductive parts 22 preferably have a high thermal conductivity like the wiring parts 16 and may be formed of a known conductive material such as copper or copper foil, which is a thick film having a thickness of about 5 μm to 50 μm. The conductive parts 22 may be formed by plating or by applying or printing a conductive paste.

The flexible base part 23 is flexible and is to be able to be deformed repeatedly with a weak force. The flexible base part 23 is desirably formed of a low elastic polyimide film with an elastic modulus of 10 GPa or less. However, polyethylene terephthalate, polyethylene naphthalate, polyimide, polyamide, silicone resin and the like can also be used as the material of the flexible base part 23. Moreover, the material of the flexible base part 23 is not limited to these as long as the material is flexible and has heat resistance. Examples of such a material include polyester film resins.

The adhesive sheet 25 is in the form of a sheet that ensures insulation between the wiring parts 16 of the divisional planar light emitter 10 and the wiring board 20 and serves to bond the wiring parts 16 to the flexible base part 23. The adhesive sheet 25 has predetermined performances in insulation, adhesion, heat resistance, and processability. The wiring board 20 and the divisional planar light emitter 10 are bonded with the adhesive sheet 25, which is flexible.

Preferably, the adhesive sheet 25 (bonding sheet) is formed of an acrylic-based, epoxy-based, urethane-based, imide-based, or silicone-based material, or a composite sheet of these materials and has a thickness of 20 μm to 150 μm. Preferably, the thickness of the adhesive sheet 25 is 0.05 times or more and 0.25 times or less the thickness of the divisional planar light emitter 10. Desirably, the curing temperature of the adhesive sheet 25 is from 80° C. to 130° C. to increase the degree of freedom in selection of materials of the light emitting module. Moreover, the adhesive sheet 25 is preferably formed of a low elasticity material with an elastic modulus of 5 GPa or less.

The insulating base part 21 and conductive parts 22, the conductive parts 22 and flexible base part 23, and the flexible base part 23 and insulating base part 21, are each affixed via an adhesive layer (adhesive) made of an epoxy resin-based adhesive, acrylic resin-based adhesive, or the like.

Incidentally, a part not requiring flexibility or a part requiring predetermined strength may be reinforced by, for example, bonding a plate member made of a resin or the like.

The wiring board 20 has a plurality of via holes 20a formed therein extending in the thickness direction at predetermined positions. The via holes 20a are filled with conductive members 28 made of a metal or the like. By the conductive members 28, the wiring parts 16 of the divisional planar light emitter 10 and corresponding ones of the conductive parts 22 of the wiring board 20 are electrically connected, so that the wiring board 20 and the plurality of light emitting elements 15 are electrically connected.

The conductive members 28 may be made of a material that contains: a metal filler containing, for example, one or more materials selected from silver, copper, nickel, tin, zinc, titanium and the like; and an epoxy resin, an acrylic resin, a urethane resin, or a silicone resin; and, if necessary, a solvent. The conductive member 28 may be formed by using a conductive paste without solvent, to restrain the generation of bubbles in the via holes 20a and to obtain a stable connection with low resistance. Taking into account the heat resistance of the light transmissive part 13, the conductive paste is preferably made of a material that is cured at a temperature of 130° C. or less, or more preferably made of a material that is cured at a temperature of 110° C. or less. Preferably, a plural number of the via holes 20a are formed in the wiring board 20 at nearby locations to increase the reliability in connecting with the wiring parts 16.

The light emitting module 100 with the above-described configurations forms the entire planar light emitter consisting of divisional planar light emitters 10 each of which is resulted in dividing a planar light emitter into pieces each having the same predetermined shape. In the light emitting module 100, the thermal expansion of a planar light emitter is proportional to the length of the planar light emitter. Considering this, even when the planar light emitter and the wiring board have different linear expansion coefficients, it is possible to reduce the influence of warping of the planar light emitter to an acceptable range by dividing the planar light emitter into a plurality of pieces to form the light emitting module 100, using low elasticity materials as the wiring board 20 and the adhesive sheet 25, and bonding and integrating them at a temperature of 130° C. or less. Accordingly, a high quality light emitting module 100 can be fabricated.

The light emitting module 100 includes the sealing part 11 including the reflective part 12 and the light transmissive part 13 with a joint surface therebetween, in which joint surface unevenness 12a that diffuses the light from the light emitting element 15 is formed. Therefore, it is possible to effectively diffuse the light and thus reduce unevenness in the brightness.

Moreover, the unevenness 12a formed in the light emitting module 100 has a configuration such that Fresnel shaped grooves 3A are formed on a principal light emitting surface 15a side of each of the light emitting elements 15 and the grooves 3A are filled with a light reflective resin. This configuration serves to effectively diffuse the light and thus reduce unevenness in the brightness. Moreover, as the warping of the planar light emitter can be reduced to a minimum, the light emitting module 100 allows the light emitting elements to emit light in a predetermined direction with high quality without deviation in the optical axes of the light emitting elements.

<Method for Manufacturing Light Emitting Module 100>

First Embodiment

Figure 3:
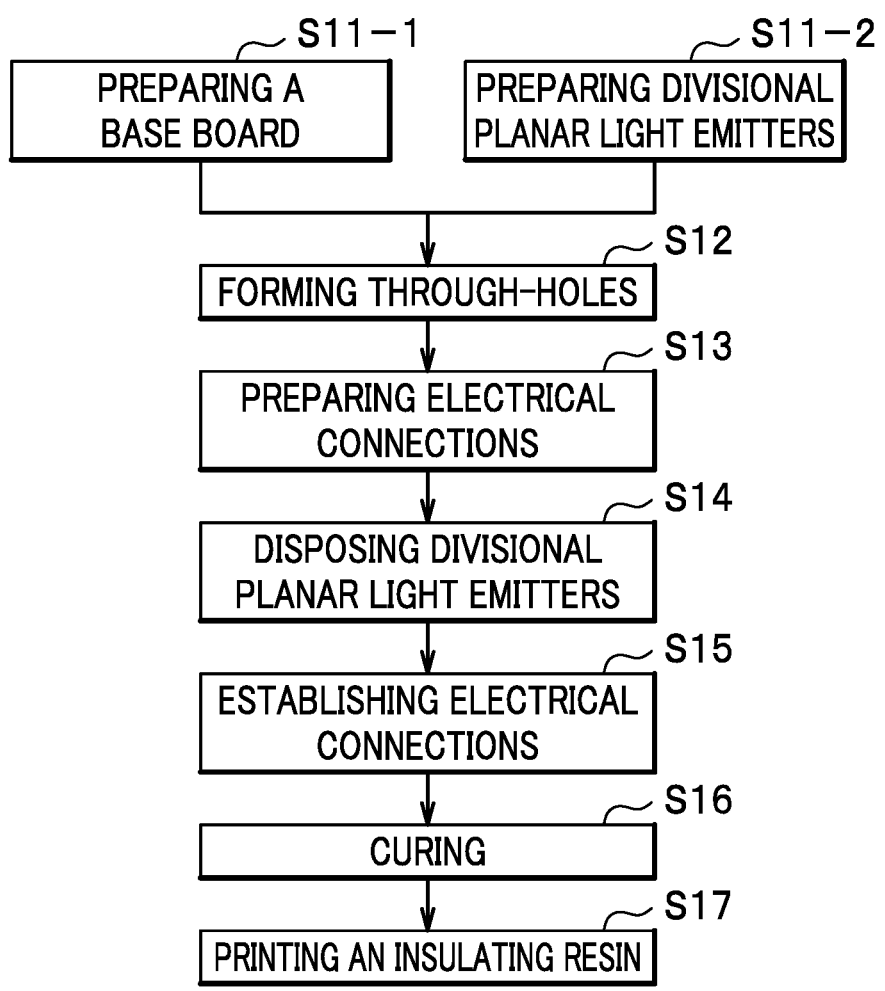
FIG. 3 is a flowchart illustrating a method for manufacturing the divisional planar light emitter according to the first embodiment.
Figure 5A:
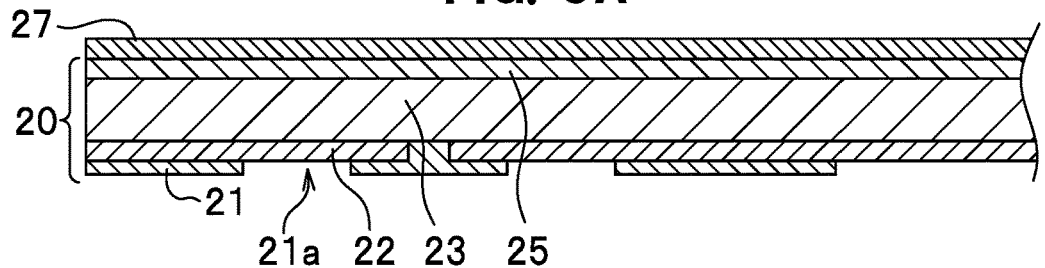
FIG. 5A is a cross-sectional view illustrating preparing a base board in a method for manufacturing the light emitting module according to the first embodiment.
Figure 5B:
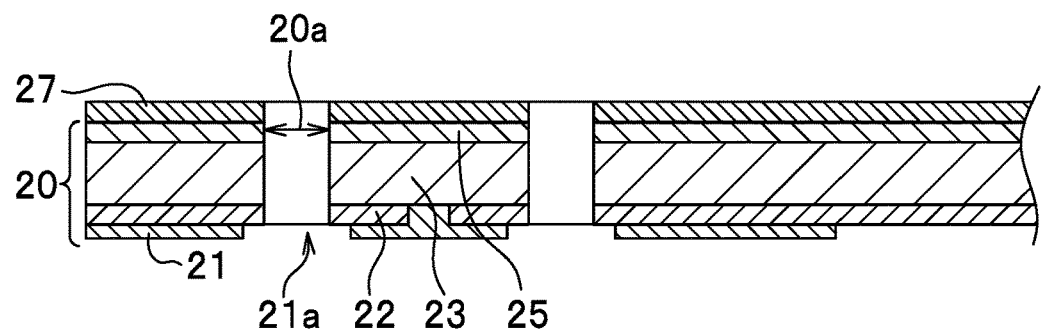
FIG. 5B is a cross-sectional view illustrating forming through-holes in the method for manufacturing the light emitting module according to the first embodiment.
Figure 5C:
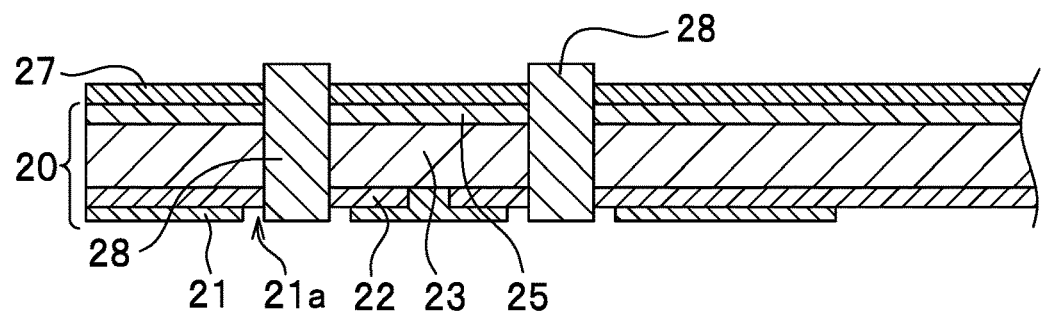
FIG. 5C is a cross-sectional view illustrating a first step in preparing electrical connections in the method for manufacturing the light emitting module according to the first embodiment.
Figure 5D:
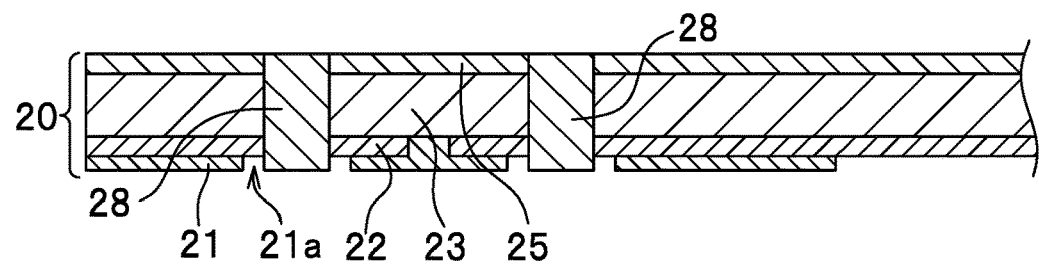
FIG. 5D is a cross-sectional view illustrating a second step in the preparing the electrical connections in the method for manufacturing the light emitting module according to the first embodiment.
Figure 5E:
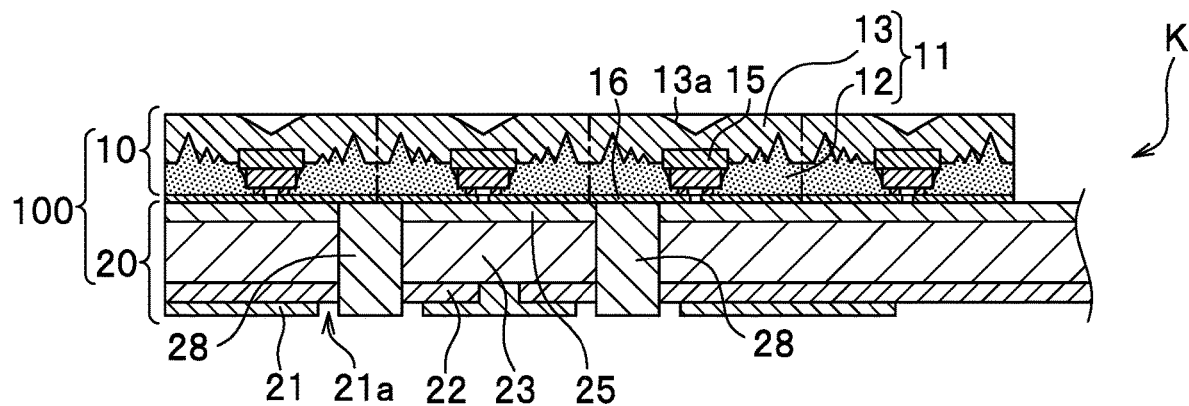
FIG. 5E is a cross-sectional view illustrating disposing divisional planar light emitters and establishing electrical connections in the method for manufacturing the light emitting module according to the first embodiment.
Figure 5F:
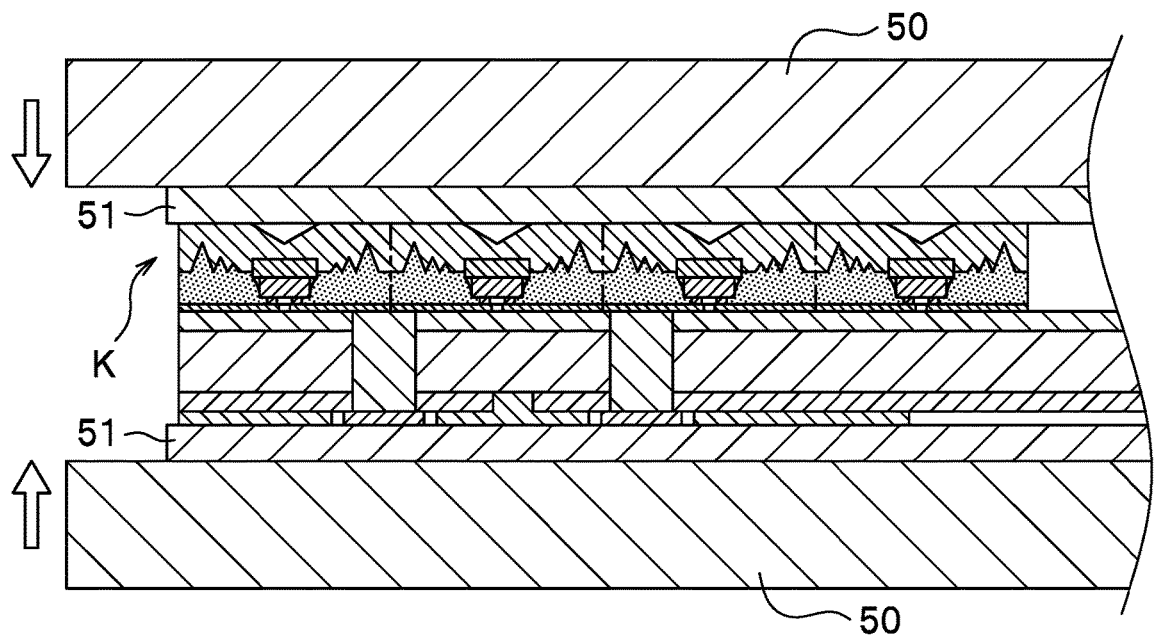
FIG. 5F is a cross-sectional view illustrating a first step in curing in the method for manufacturing the light emitting module according to the first embodiment.
Figure 5G:
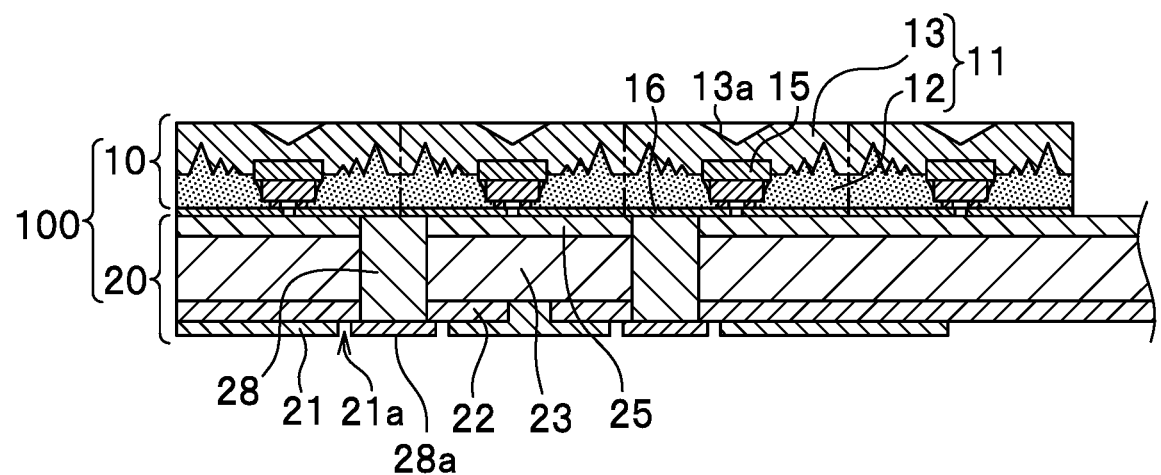
FIG. 5G is a cross-sectional view illustrating a second step in the curing in the method for manufacturing the light emitting module according to the first embodiment.
Figure 5H:
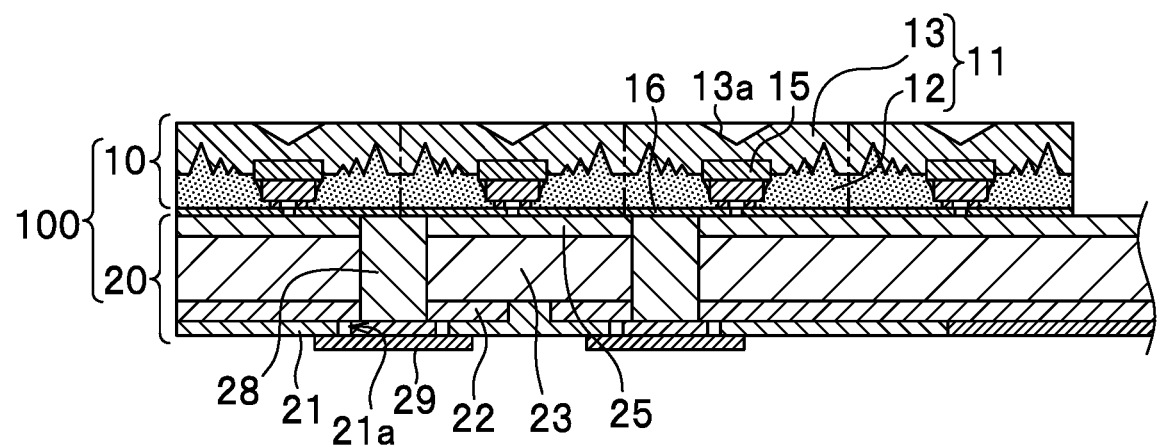
FIG. 5H is a cross-sectional view illustrating printing an insulating resin in the method for manufacturing the light emitting module according to the first embodiment.

Subsequently, a description will be given of a method for manufacturing a light emitting module, with reference to FIGS. 3, 4, and 5A to 5H. FIG. 3 is a flowchart illustrating a method for manufacturing a divisional planar light emitter according to a first embodiment. FIG. 4 is an explanatory diagram schematically illustrating the entirety and the divisional state of the divisional planar light emitters used in the light emitting module according to the first embodiment. FIG. 5A is a cross-sectional view illustrating preparing a base board in a method for manufacturing the light emitting module according to the first embodiment. FIG. 5B is a cross-sectional view illustrating forming through-holes in the method for manufacturing the light emitting module according to the first embodiment. FIG. 5C is a cross-sectional view illustrating a first step in preparing electrical connections in the method for manufacturing the light emitting module according to the first embodiment. FIG. 5D is a cross-sectional view illustrating a second step in the preparing the electrical connections in the method for manufacturing the light emitting module according to the first embodiment. FIG. 5E is a cross-sectional view illustrating disposing divisional planar light emitters and establishing electrical connections in the method for manufacturing the light emitting module according to the first embodiment. FIG. 5F is a cross-sectional view illustrating a first step in curing in the method for manufacturing the light emitting module according to the first embodiment. FIG. 5G is a cross-sectional view illustrating a second step in the curing in the method for manufacturing the light emitting module according to the first embodiment. FIG. 5H is a cross-sectional view illustrating printing an insulating resin in the method for manufacturing the light emitting module according to the first embodiment.

The method for manufacturing the light emitting module includes steps of: (a) preparing (S11-1) a base board and preparing (S11-2) divisional planar light emitters, (b) forming (S12) through-holes, (c) preparing (S13) electrical connections, (d) disposing (S14) the divisional planar light emitters, (e) establishing (S15) the electrical connections, (f) curing (S16), and (g) printing (S17) an insulating resin.

(a) Preparing a Base Board and Preparing Divisional Planar Light Emitters

As illustrated in FIG. 5A, the step of preparing (S11-1) a base board prepares the wiring board 20, and the step of preparing (S11-2) divisional planar light emitters prepares the divisional planar light emitters 10. These steps can be carried out in an arbitrary order or in parallel.

The step of preparing (S11-1) a base board fabricates a wiring board 20 in which an insulating base part 21, conductive parts 22, a flexible base part 23, and an adhesive sheet 25 are bonded together. In the step of preparing (S11-1) a base board, the insulating base part 21 is formed in such a way that the material of the insulating base part 21 is disposed on the entirety of surfaces of the conductive parts 22 and then is partially removed, or is formed in a predetermined pattern using a mask. In this embodiment, the wiring board 20 is formed such that a separator 27 is disposed on the upper surface of the adhesive sheet 25. The separator 27 is to be removed in a later-described step. That is, the separator 27 is temporarily provided.

As illustrated in FIG. 4, the step of preparing (S11-2) divisional planar light emitters divides a planar light emitter H, which includes a light transmissive part 13, a plurality of light emitting elements 15, and wiring parts 16, and has a predetermined size, into pieces each having the same predetermined shape, to fabricate a large number of divisional planar light emitters 10. As an example, the step of preparing (S11-2) divisional planar light emitters divides the planar light emitter H into divisional planar light emitters 10 each having four light emitting elements 15. To form the light emitter H before being divided, a light transmissive part 13, in which optical function parts 13a, grooves 3A, and recessed parts for disposing the light emitting elements 15 are formed, is formed. Then, in the light emitter H, element light transmissive parts 14 are respectively disposed in the recessed parts, and the light emitting elements 15 are each bonded to a corresponding one of the element light transmissive parts 14 via a light guiding member. Then, in the light emitter H, the grooves 3A and the lateral sides of the light emitting elements 15 are filled with a light reflective resin in such a way as to expose the element electrodes, to form a reflective part 12. A sealing part 11 is formed such that, around each of the light emitting elements 15, at the joint surface of the reflective part 12 and the light transmissive part 13, the reflective part 12 has unevenness 12a formed therein due to the grooves 3A and the light transmissive part 13 has unevenness 13b formed therein due to the grooves 3A. Incidentally, in the event of forming the reflective part 12, a light reflective resin may be provided to cover the element electrodes and then the light reflective resin may be cut to expose the element electrodes. The light emitter H can be formed in the process presented above as an example.

(b) Forming Through-Holes

As illustrated in FIG. 5B, the step of forming (S12) through-holes perforates the prepared wiring board 20 to form via holes 20a (through-holes) extending in the thickness direction at predetermined positions. The via holes 20a can be formed using a machining method selected, as appropriate, from punching, NC drilling, laser drilling, and the like. Although the hole diameter of the via holes 20a depends on the shape and density of the light emitting elements 15, in general, the hole diameter is 100 μm to 1000 μm. Preferably, the via holes 20a each have a hole diameter of 250 μm to 600 μm in view of the connection reliability and the reduction in the size of the device. In addition, when punching or laser drilling is used, the shape of each via hole 20a is not limited to circular and may be rectangular or elliptical as needed. The insulating base part 21 has openings 21a which have been formed in advance at positions corresponding to the via holes 20a and each of which has a width larger than the hole diameter of the corresponding via hole 20a. Incidentally, after the via holes 20a have been formed, a cleaning process is preferably carried out to remove shavings. It is preferable that the wiring parts 16 of each divisional planar light emitter 10 be on a side thereof facing the wiring board 20, the wiring board 20 have the via holes 20a (through-holes), conductive members 28 be disposed in the through-holes of the wiring board 20, and the wiring parts 16 be electrically connected with the conductive parts 22 via the conductive members 28.

(c) Preparing Electrical Connections

As illustrated in FIG. 5C, the step of preparing (S13) electrical connections fills the via holes 20a with a conductive material in the form of a paste or the like, which conductive material is to serve as electrodes, thereby to form the conductive members 28. The conductive material used to form the conductive members 28 may be provided, for example, by printing using screen artwork or metal mask. In this process, the conductive material used to form the conductive members 28, in the form of a paste, may be arranged on the separator 27 and then the filling is performed by squeezing. Preferably, after filling the via holes 20a with the conductive material used to form the conductive members 28, extra portions of the conductive members 28, which extra portions project from the front surface of the wiring board 20, are cut, and then the front surface of the wiring board 20 is processed into a flat surface by a scraper or the like so that the top surfaces of the conductive members 28 and the front surface become coplanar (see FIG. 5D).

(d) Disposing Divisional Planar Light Emitters and (e) Establishing Electrical Connections As illustrated in FIG. 5E, the step of disposing (S14) the divisional planar light emitters arranges the divisional planar light emitters 10 fabricated by the step of preparing (S11-2) divisional planar light emitters on the adhesive sheet 25 of the wiring board 20 and bond them together. This step peels off the separator 27 formed on the upper surface of the adhesive sheet 25 and disposes the divisional planar light emitters 10 in an aligned form so that adjacent divisional planar light emitters 10 have a gap of 100 µm or less therebetween. Incidentally, the structure formed by this step and composed of the plurality of divisional planar light emitters 10 and the wiring board 20 is referred to as a plate-like structure K for convenience of explanation.

The step of establishing (S15) the electrical connections establishes electrical connections between the wiring parts 16 of the divisional planar light emitters 10 and the conductive parts 22 of the wiring board 20 through the conductive members 28 disposed in the via holes 20a. The conductive members 28 have been disposed in advance in the via holes 20a by the step of preparing (S13) electrical connections, so that the conductive members 28 are exposed from the front surface of the adhesive sheet 25 of the wiring board 20. Therefore, arranging the divisional planar light emitters 10 on the adhesive sheet 25 of the wiring board 20 by the step of disposing (S14) the divisional planar light emitters causes the wiring parts 16 of each of the divisional planar light emitters 10 to come into contact with corresponding ones of the conductive members 28 and thus electrically connect with corresponding ones of the conductive parts 22 of the wiring board 20.

It is preferable to, after the step of establishing (S15) the electrical connections, form external connection parts 28a (FIG. 5G) of the conductive members 28 in respective openings 21a of the insulating base part 21 of the wiring board 20 such that the external connection parts 28a each has a diameter larger than the hole diameter of the corresponding via hole 20a. The external connection parts 28a can be formed by, for example, sputtering through a mask.

(f) Curing

As illustrated in FIGS. 5F and 5G, the step of curing (S16) causes the plate-like structure K formed by the step of disposing (S14) the divisional planar light emitters to be cured and integrated by pressing and heating the upper and lower surfaces of the plate-like structure K using heat plates 50. In the event of pressing, cushion members 51 can be used to protect the surfaces of the plate-like structure K. It is desirable to use, as the cushion members 51, a material formed of a film with low elasticity whose surfaces have been subjected to a mold release treatment using, for example, a silicone-based material or a Teflon (registered trademark)-based material, to protect the plate-like structure K. This process causes the adhesive sheet 25 to be cured to bond the members. In addition, the conductive members 28 in the via holes 20a are cured at the same time to establish via connections with a predetermined resistance. The heating temperature in the step of curing (S16) can be appropriately determined according to the materials used. It is desirable to use a temperature of about 100° C. to 130° C. from the viewpoint of expanding the choice of materials for the light transmissive part 13 and suppressing the warping of the light transmissive part 13. The heating time period in the step of curing (S16) can also be appropriately determined. To effectively suppress the warping of the divisional planar light emitters 10 due to the heating, it is preferable to keep the pressing state until the temperature of the plate-like structure K having been heated becomes, for example, 50° C. or less, or 30° C. or less. In the step of curing (S16), pressing with a predetermined pressure may be carried out while heating is carried out. For example, the pressure to be applied to the upper and lower surfaces is a pressure of 0.1 MPa to 1 MPa, and the temperature to be kept while pressing is a temperature of 100° C. to 130° C.

(g) Printing an Insulating Resin

The Step of printing (S17) an insulating resin prints insulating resin parts 29 so as to close the openings 21a of the insulating base part 21 of the wiring board 20. Incidentally, the insulating resin parts 29 may be formed so as to cover parts of the insulating base part 21, which is located on top of the insulating resin parts 29. As the material of the insulating resin, a thermosetting resin, examples of which include general epoxies, acrylics, and urethane resins, or a UV-curing resin can be used.

The light emitting module 100 can be produced with the above-described processes.

According to the method for manufacturing the light emitting module, a plurality of divisional planar light emitters 10 are disposed on the adhesive sheet 25 of the wiring board 20 and then the plurality of divisional planar light emitters 10 are bonded to the wiring board 20. As a result, it is possible to reduce the influence of the warping of the planar light emitter to an acceptable range even when the divisional planar light emitters and the wiring board 20 have different linear expansion coefficients.

Moreover, when pressing and heating the upper and lower surfaces of the plate-like structure K, which has been formed by the step of disposing (S14) the divisional planar light emitters, to cure and integrate the plate-like structure K, it is possible to restrict the deformation of the divisional planar light emitters 10 and reduce the occurrences of warping by keeping the pressing state until the temperature of the plate-like structure K having been heated becomes 50° C. or less or 30° C. or less.

Therefore, the above-described operational effects contribute to manufacturing a high-quality light emitting module 100.

Second Embodiment

Figure 6:
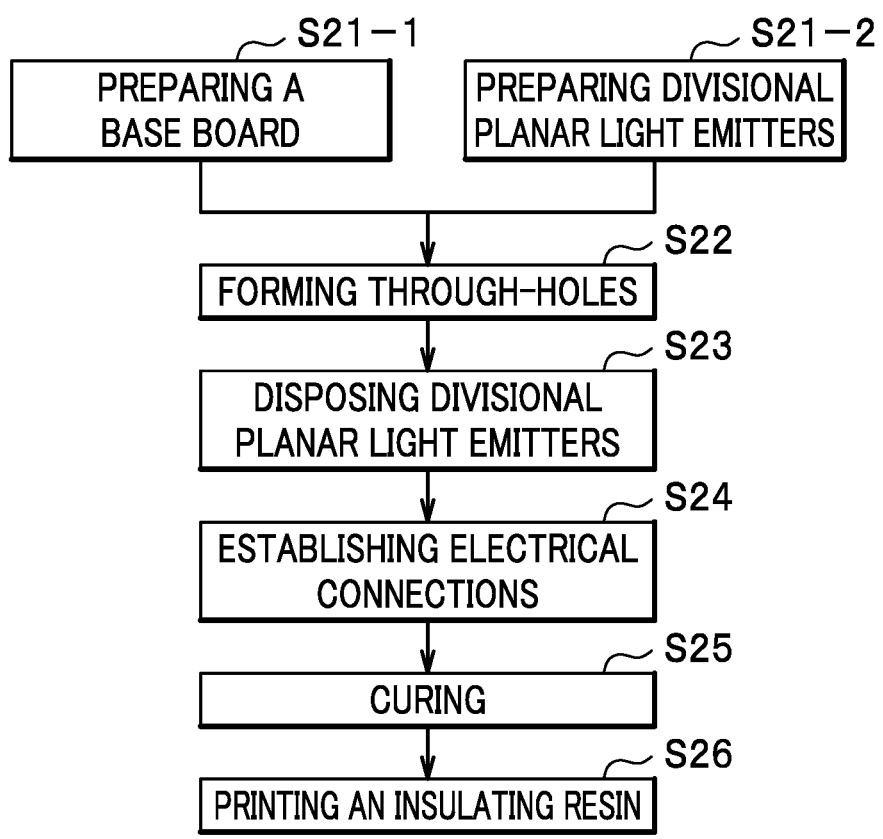
FIG. 6 is a flowchart illustrating a method for manufacturing the light emitting module according to a second embodiment.
Figure 7A:
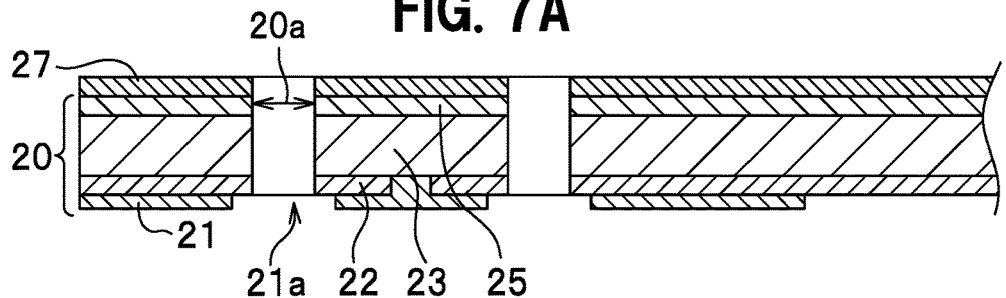
FIG. 7A is a cross-sectional view illustrating forming through-holes in the method for manufacturing the light emitting module according to the second embodiment.
Figure 7B:
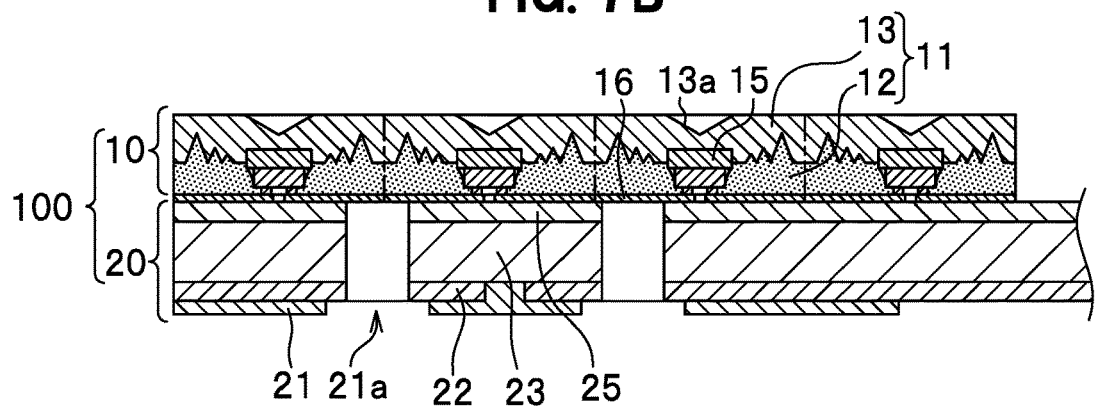
FIG. 7B is a cross-sectional view illustrating disposing divisional planar light emitters in the method for manufacturing the light emitting module according to the second embodiment.
Figure 7C:
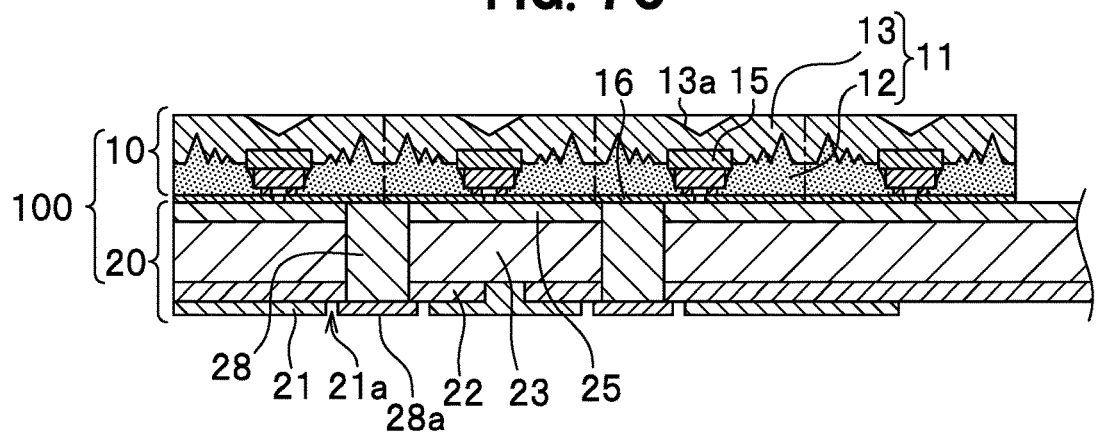
FIG. 7C is a cross-sectional view illustrating curing in the method for manufacturing the light emitting module according to the second embodiment.
Figure 7D:
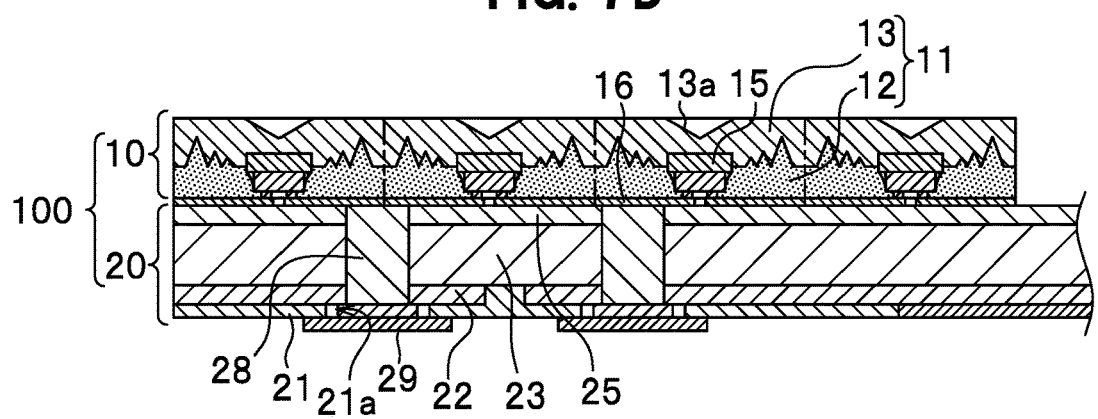
FIG. 7D is a cross-sectional view illustrating printing an insulating resin in the method for manufacturing the light emitting module according to the second embodiment.

Next, a description will be given of a second embodiment of a method for manufacturing a light emitting module, with reference to FIGS. 6, and 7A to 7D. FIG. 6 is a flowchart illustrating a method for manufacturing the light emitting module according to the second embodiment. FIG. 7A is a cross-sectional view illustrating forming through-holes in the method for manufacturing the light emitting module according to the second embodiment. FIG. 7B is a cross-sectional view illustrating disposing divisional planar light emitters in the method for manufacturing the light emitting module according to the second embodiment. FIG. 7C is a cross-sectional view illustrating curing in the method for manufacturing the light emitting module according to the second embodiment. FIG. 7D is a cross-sectional view illustrating printing an insulating resin in the method for manufacturing the light emitting module according to the second embodiment.

The method for manufacturing a light emitting module according to the second embodiment includes steps of: (a) preparing (S21-1) a base board and preparing (S21-2) divisional planar light emitters, (b) forming (S22) through-holes, (c) disposing (S23) the divisional planar light emitters, (d) establishing (S24) electrical connections, (e) curing (S25), and (f) printing (S26) an insulating resin.

The method for manufacturing the light emitting module according to the second embodiment differs from the method for manufacturing the light emitting module according to the first embodiment in that the step of preparing electrical connections is not performed.

As illustrated in FIG. 7A, (a) the step of preparing (S21-1) a base board and the step of preparing (S21-2) divisional planar light emitters, and (b) the step of forming (S22) through-holes (FIG. 7A) are the same as those in the manufacturing method according to the first embodiment.

(c) Disposing the Divisional Planar Light Emitters

As illustrated in FIG. 7B, the step of disposing (S23) the divisional planar light emitters arranges the divisional planar light emitters 10, which have been fabricated by the step of preparing (S21-2) divisional planar light emitters, on the adhesive sheet 25 of the wiring board 20 and bond them together. The step of disposing (S23) the divisional planar light emitters is the same as the step of disposing (S14) the divisional planar light emitters of the manufacturing method of the first embodiment except that the divisional planar light emitters 10 are arranged in a state in which the conductive members 28 are not disposed in the via holes 20a of the wiring board 20.

(d) Establishing Electrical Connections

The step of establishing (S24) electrical connections fills the via holes 20a with the conductive material used to form the conductive members 28 as illustrated in FIG. 7C to electrically connect the wiring parts 16 of the divisional planar light emitters 10 to the conductive parts 22 of the wiring board 20.

Incidentally, the manufacturing method of the second embodiment is the same as the manufacturing method of the first embodiment in that after the step of establishing (S24) electrical connections, external connection parts 28a of the conductive members 28 are formed in respective openings 21a of the insulating base part 21 of the wiring board 20 such that the external connection parts 28a each has a diameter larger than the hole diameter of the corresponding via hole 20a.

The (e) step of curing (S25) (see FIG. 7C) and the (f) step of printing (S26) an insulating resin (see FIG. 7D) are also the same as those of the manufacturing method of the first embodiment.

In the step of establishing (S24) electrical connections, in the event of filling the via holes 20a with the conductive material used to form the conductive members 28, it is effective to carry out the printing in a vacuum apparatus to restrain bubbles from occurring and thereby establish stable connections. It is preferable that the degree of vacuum in the vacuum apparatus be 0.001 MPa or less. It is possible to, after the printing, perform preliminary curing by adding pressure in a pressurized vessel to eliminate bubbles. In this event, it is preferable that pressurizing be carried out under the conditions of a pressure of 0.2 MPa to 1 MPa and a temperature of 50° C. to 80° C.

According to the manufacturing method of the light emitting module, a plurality of divisional planar light emitters 10 are arranged and then bonded to the wiring board 20. As a result, it is possible to reduce the influence of the warping of the planar light emitter to an acceptable range even when the divisional planar light emitters 10 and the wiring board 20 have different linear expansion coefficients. Therefore, the manufacturing method of the second embodiment is also capable of manufacturing a high-quality light emitting module like the manufacturing method of the first embodiment.

EXAMPLES

Examples 1 to 3 and Comparative Examples 1 to 4

A measurement was conducted to measure the amount of warping of light emitting devices of Examples 1 to 3 and Comparative Examples 1 to 4.

The amount of warping was measured for the cases of Examples 1 to 3 and Comparative Examples 1 to 4, which were configured to have gaps between divisional planar light emitters as shown in Table 1. Each of the divisional planar light emitters included light emitting elements in 10 columns by 14 rows. The size of each of the divisional planar light emitters was about 20 mm×22 mm. The external size of the light emitting module formed by arranging the divisional planar light emitters was about 200 mm×300 mm. The amount of warping was measured in terms of the maximum amount of warping relative to the thickness of the divisional planar light emitters. The amount of warping was measured as to the height using a micrometer. Specifically, using the micrometer, the height of the highest position of (an end portion) relative to the center of the divisional planar light emitters was measured.

TABLE 1

| | Gap between segments | Amount of warping (200 mm width) | Optical characteristics | Bendable amount (200 mm width) |
|---|---|---|---|---|
| Comparative Example 1 | 200 μm | 0.5 mm | Gaps recognizable | 100 mm or more |
| Comparative Example 2 | 175 μm | 0.5 mm | Gaps recognizable | 100 mm or more |
| Example 1 | 150 μm | 0.5 mm | Gaps unrecognizable | 100 mm or more |
| Example 2 | 50 μm | 0.7 mm | Gaps unrecognizable | 100 mm |
| Example 3 | 25 μm | 0.8 mm | Gaps unrecognizable | 80 mm |
| Comparative Example 3 | 20 μm | 1.5 mm | Gaps unrecognizable | 40 mm |
| Comparative Example 4 | 15 μm | 2.0 mm | Gaps unrecognizable | 20 mm |

According to this, when adjacent divisional planar light emitters have a gap of 175 μm or more therebetween, an observer recognizes the gap in terms of the optical characteristics and thus senses discontinuity. In contrast, when adjacent divisional planar light emitters have a gap of 150 μm of less therebetween, an observer cannot recognize the gap and thus senses continuity. In addition, the amount of warping is reduced as low as about 0.5 mm. In addition, the light emitting module can be bended as large as a bendable amount of 100 mm or larger.

On the other hand, when adjacent divisional planar light emitters have a gap of 20 μm of less therebetween, the amount of warping increases as large as 1.5 mm or larger. In addition, the bendable amount decreases to 40 mm or less, leading to a decrease in workability. Therefore, the gap between adjacent divisional planar light emitters is preferably 22 μm or more, or more preferably 28 μm or more.

Examples 4 to 6 and Comparative Examples 5 to 7

A measurement was conducted in the curing process to measure the release temperature and the amount of warping of a plate-like structure having been heated. The plate-like structure was cured in the curing process by pressing and heating its upper and lower surfaces and then was released after the temperature of the heated plate-like structure has decreased to a predetermined temperature. The result is shown in Table 2.

TABLE 2

|  | Press release temperature | Amount of warping (200 mm width) |
| --- | --- | --- |
| Comparative Example 5 | 100° C. | 3.0 mm |
| Comparative Example 6 | 75° C. | 2.5 mm |
| Comparative Example 7 | 60° C. | 2.0 mm |
| Example 4 | 50° C. | 1.5 mm |
| Example 5 | 40° C. | 1.3 mm |
| Example 6 | 30° C. | 1.2 mm |

In the cases of Comparative Examples 5 to 7 in which the plate-like structure was released at an earlier time corresponding to a temperature of 60° C. or higher, the amount of warping was as large as 2.0 mm or larger. In contrast, in the cases of Examples 4 to 6 in which the plate-like structure was released at a time corresponding to a temperature of 50° C. or lower, the amount of warping was 1.5 mm or less, i.e., the amount of warping was reduced.

INDUSTRIAL APPLICABILITY

The light emitting module according to the present disclosure can be used, for example, as a backlight of a liquid crystal display device.

REFERENCE CHARACTER LIST

100 light emitting module
K plate-like structure
H planar light emitter
10 divisional planar light emitter
11 sealing part
12 reflective part
12*a* unevenness
13 light transmissive part
13*a* optical function part
15 light emitting element
15*a* principal light emitting surface
15*b* electrode formation surface
15*c* electrode
16 wiring part
20 wiring board (base board)
20*a* via hole (through-hole)
21 insulating base part
21*a* opening
22 conductive part
23 flexible base part
25 adhesive sheet
27 separator
28 conductive member
28*a* external connection part
29 insulating resin part
50 heat plate

The invention claimed is:

1. A light emitting module comprising:
a wiring board; and
a plurality of divisional planar light emitters disposed adjacent to each other on one surface of the wiring board;
wherein the wiring board comprises:
an insulating base part,
a plurality of conductive parts joined to the insulating base part, and
a flexible base part joined to the conductive parts; and
wherein each of the plurality of divisional planar light emitters comprises:
a plurality of wiring parts,
a plurality of light emitting elements each disposed on corresponding ones of the wiring parts, and
a sealing part sealing the plurality of light emitting elements and covering the wiring parts, the sealing part comprising:
a light transmissive part configured to transmit light from the light emitting elements toward a light extraction surface, the light transmissive part having a surface, opposite to the light extraction surface, in which Fresnel-shaped grooves are formed, and
a reflective part configured to reflect the light from the light emitting elements toward the light extraction surface, the reflective part being formed of a light reflective resin and having portions that fill the Fresnel-shaped grooves of the light transmissive part.

2. The light emitting module according to claim 1,
wherein the reflective part is formed with a height extending from the wiring parts to a position exceeding a height of the plurality of light emitting elements; and
wherein the light transmissive part is formed with a height extending from the reflective part to an upper surface of the sealing part.

3. The light emitting module according to claim 1,
wherein each of the plurality of divisional planar light emitters further comprises a plurality of element light transmissive parts, each of which is disposed between a respective one of the plurality of light emitting elements and the light transmissive part.

4. The light emitting module according to claim 1,
wherein the insulating base part is composed of a plurality of layers.

5. The light emitting module according to claim 1,
wherein each of the plurality of divisional planar light emitters includes optical function parts each located directly above a corresponding one of the plurality of light emitting elements in a plan view and configured to reflect light emitted from the corresponding one of the plurality of light emitting elements.

6. The light emitting module according to claim 5, wherein the optical function parts each have an inverted cone shaped recess.

7. The light emitting module according to claim 6, wherein the optical function parts each have a reflective member disposed in the inverted cone shaped recess.

8. The light emitting module according to claim 1, wherein the wiring board is flexible.

9. The light emitting module according to claim 1, wherein a thickness of the wiring board is 0.01 times or more and 0.25 times or less a thickness of the plurality of divisional planar light emitters.

10. The light emitting module according to claim 1, wherein each of the plurality of divisional planar light emitters has a surface which faces the wiring board and on which the wiring parts are located;
wherein the wiring board comprises through-holes;
wherein the wiring board comprises conductive members respectively disposed in the through-holes; and
wherein the wiring parts are electrically connected with corresponding ones of the conductive parts via corresponding ones of the conductive members.

11. The light emitting module according to claim 3, wherein each of the element light transmissive parts includes a wavelength conversion member that converts a wavelength of light emitted from the respective one of the light emitting elements.

12. The light emitting module according to claim 1, wherein adjacent ones of the plurality of divisional planar light emitters have a gap of 150 μm or less therebetween.

13. The light emitting module according to claim 1, wherein adjacent ones of the plurality of divisional planar light emitters have a gap of 22 μm or more and 150 μm or less therebetween.

14. The light emitting module according to claim 1, wherein the wiring board is bonded to the plurality of divisional planar light emitters via an adhesive sheet that is flexible.

15. The light emitting module according to claim 1, wherein the wiring board is bonded to the plurality of divisional planar light emitters via an adhesive sheet that is flexible;
wherein the light transmissive part of the sealing part of each of the plurality of divisional planar light emitters is made of a polycarbonate resin;
wherein the adhesive sheet is made of at least one of: an acrylic resin, a urethane resin, or a silicone resin and
wherein the flexible base part is made of at least one of polyethylene naphthalate, polyethylene terephthalate, polyimide, polyamide, or a silicone resin.

16. A method for manufacturing a light emitting module, the method comprising steps of:
preparing a wiring board in which an insulating base part, conductive parts, and a flexible base part are laminated;
preparing a plurality of divisional planar light emitters resulted in dividing a workpiece so that each of the plurality of divisional planar light emitters comprises wiring parts, a plurality of light emitting elements each disposed on corresponding ones of the wiring parts, and a sealing part that seals the plurality of light emitting elements;
forming through-holes in the wiring board in a thickness direction thereof at predetermined positions;
disposing the plurality of divisional planar light emitters on the insulating base part of the wiring board to form a plate-like structure;
establishing electrical connections that electrically connect the wiring parts of each of the plurality of divisional planar light emitters to corresponding ones of the conductive parts of the wiring board through corresponding ones of the through-holes; and
curing the plate-like structure by pressing and heating upper and lower surfaces of the plate-like structure.

17. The light emitting module according to claim 16, wherein the step of curing the plate-like structure by pressing and heating the upper and lower surfaces of the plate-like structure comprises keeping a compressing state until a temperature of the plate-like structure after having been heated becomes 50° C. or less.

18. The light emitting module according to claim 16, wherein the step of curing the plate-like structure by pressing and heating the upper and lower surfaces of the plate-like structure comprises pressing the upper and lower surfaces of the plate-like structure with a pressure of 0.1 MPa to 1 MPa while keeping a heating temperature within a range from 100° C. to 130° C.

* * * * *